United States Patent
Tanno et al.

(10) Patent No.: US 11,057,014 B2
(45) Date of Patent: Jul. 6, 2021

(54) BONDED SUBSTRATE AND A MANUFACTURING METHOD THEREOF, AND A SURFACE ACOUSTIC WAVE DEVICE USING THE SAID BONDED SUBSTRATE

(71) Applicant: SHIN-ETSU CHEMICAL CO., LTD., Tokyo (JP)

(72) Inventors: Masayuki Tanno, Annaka (JP); Koji Kato, Takasaki (JP); Yoshinori Kuwabara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 624 days.

(21) Appl. No.: 15/762,139

(22) PCT Filed: Sep. 13, 2016

(86) PCT No.: PCT/JP2016/076924
§ 371 (c)(1),
(2) Date: Mar. 22, 2018

(87) PCT Pub. No.: WO2017/051747
PCT Pub. Date: Mar. 30, 2017

(65) Prior Publication Data
US 2018/0294793 A1    Oct. 11, 2018

(30) Foreign Application Priority Data

Sep. 26, 2015 (JP) .............................. JP2015-189028
Jan. 19, 2016 (JP) .............................. JP2016-007612

(51) Int. Cl.
*H03H 9/02* (2006.01)
*H03H 9/25* (2006.01)

(52) U.S. Cl.
CPC .... *H03H 9/02842* (2013.01); *H03H 9/02559* (2013.01); *H03H 9/02574* (2013.01); *H03H 9/02834* (2013.01); *H03H 9/25* (2013.01)

(58) Field of Classification Search
CPC .......... H03H 9/02842; H03H 9/02559; H03H 9/02574; H03H 9/02834
See application file for complete search history.

(56) References Cited

U.S. PATENT DOCUMENTS

2015/0091416 A1    4/2015  Hori et al.

FOREIGN PATENT DOCUMENTS

JP    2013-66032 A    4/2013
JP    2014-69994 A    4/2014
(Continued)

OTHER PUBLICATIONS

International Search Report dated Dec. 6, 2016 in PCT/JP2016/076924 filed Sep. 13, 2016.
(Continued)

*Primary Examiner* — Derek J Rosenau
(74) *Attorney, Agent, or Firm* — Oblon, McClelland, Maier & Neustadt, L.L.P.

(57) ABSTRACT

An object of the present invention is to provide a bonded substrate which is excellent in temperature characteristics and suppresses unnecessary response due to reflection of an elastic wave at a bonding interface.
[Means to Solve the Problems] The present invention is unique in that a bonded substrate is constructed by bonding a $LiTaO_3$ substrate and a base plate wherein a Li concentration at a base plate-bonding face of the $LiTaO_3$ substrate is higher than that at a $LiTaO_3$ substrate-side end face of the bonded substrate, that the difference between the Li concentration at the base plate-bonding face of the $LiTaO_3$ substrate and the Li concentration at the $LiTaO_3$ substrate- (Continued)

side end face of the bonded substrate is 0.1 mol % or greater, that the Li concentration at the base plate-bonding face of the $LiTaO_3$ substrate satisfies an equation $Li/(Li+Ta) \times 100 = (50+\alpha)$ mol %, where $\alpha$ is in the range of $-1.2 < \alpha < 0.5$, that the Li concentration at the $LiTaO_3$ substrate-side end face of the bonded substrate satisfies an equation $Li/(Li+Ta) \times 100 = (48.5+\beta)$ mol %, where $\beta$ is in the range of $-0.5 < \beta < 0.5$, and that the thickness measured from the base plate-bonding face of the $LiTaO_3$ substrate to the $LiTaO_3$ substrate-side end face of the finished bonded substrate becomes greater than 5 times but less than 20 times the wavelength of the surface acoustic wave or that of the leaky surface acoustic wave.

15 Claims, 4 Drawing Sheets

(56) References Cited

FOREIGN PATENT DOCUMENTS

| | | |
|---|---|---|
| JP | 2015-98410 A | 5/2015 |
| WO | 2014/010696 A1 | 1/2014 |

OTHER PUBLICATIONS

Miura, M. et al., "Temperature Compensated $LiTaO_3$/Sapphire Bonded SAW Substrate with Low Loss and High Coupling Factor Suitable for US-PCS Application", 2004 IEEE Ultrasonics Symposium, 2004 IEEE International Ultrasonics, Ferroelectrics, and Frequency Control Joint 50th Anniversary Conference, 2004, pp. 1322-1325.

BONDED SUBSTRATE AND A MANUFACTURING METHOD THEREOF, AND A SURFACE ACOUSTIC WAVE DEVICE USING THE SAID BONDED SUBSTRATE

TECHNICAL FIELD

The present invention relates to a bonded substrate which is a lithium tantalate single crystal substrate or a lithium niobate single crystal substrate bonded to a base plate, and a method of manufacturing the same, and the invention also relates to a surface acoustic wave device using the same bonded substrate.

BACKGROUND ART

A SAW (Surface Acoustic Wave) device having a comb-like electrode for exciting a surface acoustic wave on a piezoelectric substrate is used as a component for frequency adjustment and selection of a mobile phone.

For this surface acoustic wave device, a piezoelectric material, such as lithium tantalate ($LiTaO_3$; LT) and lithium niobate ($LiNbO_3$; LN), is used to make it, because piezoelectric materials meet the requirements of smallness in size, small insertion loss, and ability to stop passage of unnecessary waves.

In recent years, the communication band used in mobile phones has been tending to have a narrower band-to-band spacing and a wider individual bandwidth, and consequently the surface acoustic wave device, whose properties undergo changes with varying temperature, is being required to have reduced tendency in such changes.

As an example of a piezoelectric material meeting such a requirement, for example, Non-IP Document 1 has reported that the fluctuation in frequency of a surface acoustic wave device due to temperature can be reduced by using a substrate in which lithium tantalate and sapphire are bonded to each other.

PRIOR ART DOCUMENTS

Non-IP Publications

Non-IP Publication 1:
M. Miura, T. Matsuda, Y. Satoh, M. Ueda, O. Ikata, Y. Ebata, and H. Takagi, "Temperature Compensated $LiTaO_3$/Sapphire Bonded SAW Substrate with Low Loss and High Coupling Factor Suitable for US-PCS Application," Proc. IEEE. Ultrason. Symp., pp. 1322-1325, 2004.

SUMMARY OF THE INVENTION

Problems to be Solved by Invention

However, in the substrate reported in non-IP Publication 1, since two materials having different acoustic impedances are combined, there occurs a problem that the elastic wave excited on the lithium tantalate surface is reflected at the junction interface and becomes manifest as an unnecessary response. Accordingly, in the same document, it is shown that the unnecessary response is decreased by increasing the thickness of the lithium tantalate.

As a result of investigations conducted independently by the present inventors, a problem was found that when the thickness of the lithium tantalate of the bonded substrate is increased, the value Q of the surface acoustic wave resonator or the pseudo surface acoustic wave resonator, which is the basic element of the surface acoustic wave device, drops to a level of normal (non-crystal) lithium tantalate.

It is therefore an object of the present invention to provide a bonded substrate having excellent temperature characteristics and high value of Q, a method of manufacturing the same, and a surface acoustic wave device using this bonded substrate.

The inventors of the present invention diligently studied about the $LiTaO_3$ substrate constituting the bonded substrate, and as a result they discovered that when the Li concentration at the bonding face of the $LiTaO_3$ substrate is larger than the Li concentration on the exposed surface side of the $LiTaO_3$ substrate, energy is confined in the vicinities of the exposed surface of the $LiTaO_3$ substrate (a region with a small Li concentration) where the acoustic wave velocity is lower due to the tendency of the acoustic wave to go to a region with smaller Li concentration (a region with a low velocity), so that the acoustic wave energy concentrates there, with a consequence that the value Q of the resonator is pushed up, and hence possessed the present invention.

Means for Solving the Problem

Accordingly, the present invention relates to a bonded substrate comprising a $LiTaO_3$ substrate and a base plate, wherein the Li concentration at that face of the $LiTaO_3$ substrate which is in contact with the base plate is higher than the Li concentration at a $LiTaO_3$ substrate-side (exposed) end face of the composite bonded substrate.

Also, it is preferable that the Li concentration at the base plate-bonding face of the $LiTaO_3$ substrate differs from the Li concentration at the $LiTaO_3$ substrate-side end face of the composite bonded substrate by 0.1 mol % or greater.

The Li concentration at the base plate-bonding face of the $LiTaO_3$ substrate is preferably such that it satisfies $Li/(Li+Ta) \times 100 = (50+\alpha)$ mol %, where Li is Li concentration, Ta is Ta concentration, $\alpha$ is in the range of $-1.2 < \alpha < 0.5$, and the Li concentration at the $LiTaO_3$ substrate-side end face of the bonded substrate is preferably such that it satisfies $Li/(Li+Ta) \times 100 = (48.5+\beta)$ mol %, where $\beta$ is in the range of $-0.5 < \beta < 0.5$.

It is also preferable that the thickness of the $LiTaO_3$ substrate in the bonded substrate is greater than 5 times but less than 20 times the wavelength of the surface acoustic wave or that of the leaky surface acoustic wave.

It is also preferable that an area in which the Li concentration satisfies the above formula meant for the base plate-bonding face of the $LiTaO_3$ substrate of the present invention extends from this bonding face of the $LiTaO_3$ substrate toward the $LiTaO_3$ substrate-side end face of the bonded substrate (that is, into the $LiTaO_3$ substrate) by a distance of 0.1 through 4 times the wavelength of the surface acoustic wave or that of the leaky surface acoustic wave.

It is furthermore preferable that the bonded substrate of the present invention has an area extending from the bonding face of the $LiTaO_3$ substrate toward the $LiTaO_3$ substrate-side end face of the bonded substrate in which (area) the Li concentration decreases as the depth from the bonding face of the $LiTaO_3$ substrate increases; and it is further preferable that this area, in which the Li concentration thus decreases, is formed to have a thickness of 1 through 5 times the wavelength of the surface acoustic wave or that of the leaky surface acoustic wave. In addition to this, the range of the Li concentration in the $LiTaO_3$ substrate-side end face of the bonded substrate of the present invention is preferably formed over a span of 1 through 20 times the wavelength of the surface acoustic wave or that of the leaky surface acoustic wave from the $LiTaO_3$ substrate-side end face of the bonded substrate toward the bonding face of the $LiTaO_3$ substrate.

It is preferable that the crystal orientation of the $LiTaO_3$ substrate of the present invention is rotated from 36° Y through 49° Y cut, and also that the base plate used in the present invention is made of a material selected from Si, SiC, Spinel, and sapphire.

Furthermore, the present invention is characteristic also in that, in a bonded substrate composed of a $LiNbO_3$ substrate and a base plate, the Li concentration at a base plate-bonding face of the $LiNbO_3$ substrate is greater than the Li concentration at a $LiNbO_3$ substrate-side end face of the bonded substrate.

The method of manufacturing a bonded substrate according to the present invention is characteristic in that a base plate and a $LiTaO_3$ substrate in which the Li concentration is greater at the substrate surface than inside the substrate are bonded together, and that a surface layer at the $LiTaO_3$ substrate-side end face of the bonded substrate which lies opposite the bonding face of the $LiTaO_3$ substrate is removed in a manner such that the Li concentration at the bonding face of the $LiTaO_3$ substrate becomes greater than that at the $LiTaO_3$ substrate-side end face of the bonded substrate.

It is preferable if the bonded substrate of the present invention is used for surface acoustic wave device.

Effects of the Invention

According to the present invention, it is possible to improve the Value Q of the bonded substrate for surface acoustic waves. Accordingly, it becomes possible to increase the thickness of the piezoelectric layer to thereby facilitate the removal of the unnecessary response caused by reflective waves, so that it is now possible to provide a bonded substrate for surface acoustic wave which has a reduced loss and which can improve the suppression degree outside the band when formed into a filter.

EMBODIMENTS FOR CARRYING OUT THE INVENTION

Hereinafter, embodiments of the present invention will be described in detail, but the present invention is not limited thereto.

Figure 6:
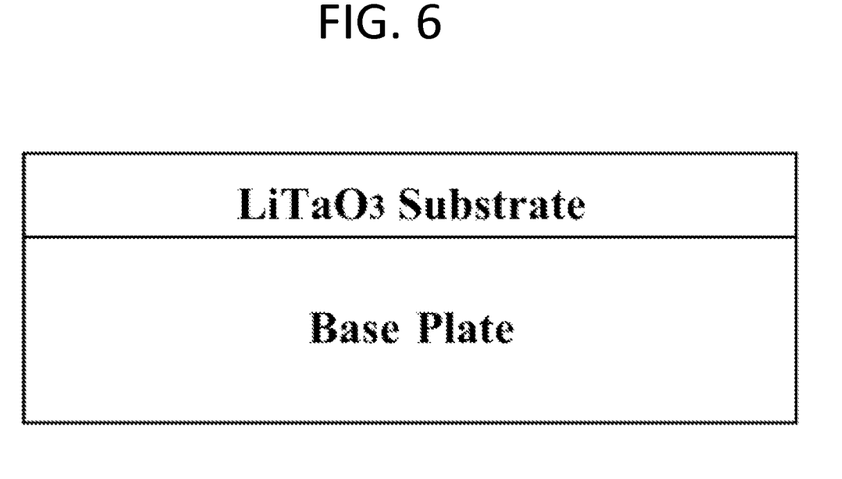
FIG. 6 A cross section of a bonded substrate including a $LiTaO_3$ and a base plate.

The bonded substrate of the present invention is formed by bonding a $LiTaO_3$ substrate on a base plate (see FIG. 6). A known method may be used for bonding the $LiTaO_3$ substrate on the base plate, but considering the base plate's influence to bend the substrate, it is preferable to use the room temperature bonding method.

Further, intervening layers made of materials such as $oSiO_2$, $SiO_{2 \pm 0.5}$, a-Si, p-Si, a-SiC, $Al_2O_3$ and the like may be present between the $LiTaO_3$ substrate and the base plate.

The bonded substrate of the present invention is characteristic in that the Li concentration at the base plate-bonding face of the $LiTaO_3$ substrate is higher than the Li concentration at the $LiTaO_3$ substrate-side end face of the bonded substrate. Therefore, there is a difference in Li concentration in the thickness direction of the $LiTaO_3$ substrate bonded to the base substrate.

In the case where an intervening layer is present between the $LiTaO_3$ substrate and the base plate, the base plate-bonding face of the $LiTaO_3$ substrate shall be deemed to mean the face of the $LiTaO_3$ substrate in contact with the intervening layer.

Such a $LiTaO_3$ substrate can be obtained by diffusing Li from the surface of the $LiTaO_3$ substrate by a known method such as vapor phase diffusion method, for example. Since the Li concentration of the thus obtained substrate at the surface thereof would become large and the Li concentration inside the substrate would be smaller, if the $LiTaO_3$ substrate is machined by grinding or polishing or the like to expose the inside of the $LiTaO_3$ substrate and the non-machined surface is made to be the base plate-bonding face, a bonded substrate of the present invention is obtained.

Further, the $LiTaO_3$ substrate constituting the bonded substrate of the present invention may itself be a bonded substrate composed of a plurality of $LiTaO_3$ substrates. It is also possible to manufacture a bonded substrate of the present invention by preparing a $LiTaO_3$ substrate having a small Li concentration and a $LiTaO_3$ substrate having a high Li concentration and bonding these to a base plate. For example, on one hand, as a $LiTaO_3$ substrate with a small Li concentration, a $LiTaO_3$ substrate of a congruent melt composition manufactured by a usual Czochralski method may be used, and on the other, as a $LiTaO_3$ substrate having a large Li concentration, a $LiTaO_3$ substrate of a stoichiometric composition manufactured by a double crucible method may be used.

Further, the $LiTaO_3$ substrate constituting the bonded substrate of the present invention may be doped with a metal element such as Fe if necessary, or it may be subjected to a reduction treatment for suppressing the pyroelectricity.

In the present invention, the difference between the Li concentration at the base plate-bonding face of the $LiTaO_3$ substrate and the Li concentration at the $LiTaO_3$ substrate-side end face of the bonded substrate is preferably 0.1 mol % or greater, or more preferably 0.25 mol % or greater, or still more preferably 0.5 mol % or greater. The upper limit of this difference is the difference between the stoichiometric composition (50±0.5 mol %) and the congruent melt composition (48.5±0.5 mol %), preferably 2.5 mol % or less, more preferably 2.0 mol % or less, still more preferably 1.5 mol % or less.

In the present invention, the Li concentration at the base plate-bonding face of the $LiTaO_3$ substrate is $Li/(Li+Ta) \times 100 = (50+\alpha)$ mol %, where $\alpha$ is in the range of $-1.2 < \alpha < 0.5$, preferably in the range of $-1.0 < \alpha < 0.5$, more preferably in the range of $-0.8 < \alpha < 0.5$, or still more preferably in the range of $-0.8 < \alpha \leq 0$.

From the viewpoints of easiness in manufacturing and manufacturing cost, the $LiTaO_3$ substrate constituting the bonded substrate of the present invention is preferably manufactured by first preparing a $LiTaO_3$ substrate having a congruent melt composition through an ordinary Czochralski method and then applying it to a Li diffusion treatment by means of a gas phase method. When the $LiTaO_3$ substrate is produced in this way, the Li concentration at the substrate surface becomes $Li/(Li+Ta)\times100=(50+\alpha)$ mol % where $\alpha$ is in the range of $-1.2<\alpha<0.5$, which is close to the stoichiometric composition.

The longer the time of applying the Li diffusion treatment is, the more likely warpage and cracking would occur in the substrate, so that it is preferable that the area wherein the Li concentration satisfies $Li/(Li+Ta)\times100=(50+\alpha)$ mol % where $\alpha$ is in the range of $-1.2<\alpha<0.5$ extends from the bonding face of the $LiTaO_3$ substrate toward the $LiTaO_3$ substrate-side end face of the bonded substrate by a limited distance of about 0.1 through 4 times the wavelength of the surface acoustic wave or the leaky surface acoustic wave. By doing so, it is possible to suppress warping and cracking of the substrate and to increase the value Q of the bonded substrate.

Further, in the present invention, it is preferable to have an area in which the Li concentration decreases as the measurement moves from the bonding face of the $LiTaO_3$ substrate toward the $LiTaO_3$ substrate-side end face of the bonded substrate. Such a bonded substrate can be manufactured by using, as the $LiTaO_3$ substrate of a bonded substrate, a $LiTaO_3$ substrate having been subjected to a Li diffusion treatment by a gas phase method. In this case, if a bonded substrate in which the Li concentration profile has a steep variation is used, although it is possible to increase the Value Q of the resonator, there is a possibility that a response noise is generated due to a steep Li concentration variation. For this reason, it is preferable that the area in which the Li concentration decreases from the bonding face of the $LiTaO_3$ substrate toward the $LiTaO_3$ substrate-side end face of the bonded substrate spans over 1 to 5 times the wavelength of the surface acoustic wave or the leaky surface acoustic wave. In this way, it is possible not only to manufacture the device easily but also to suppress the response noise caused by the steep Li concentration change.

In the bonded substrate of the present invention, it is preferable that, on one hand, the Li concentration at the bonding face of the $LiTaO_3$ substrate satisfies $Li/(Li+Ta)\times100=(50+\alpha)$ mol % where $\alpha$ is in the range of $-1.2<\alpha<0.5$, and, on the other hand, the Li concentration at the $LiTaO_3$ substrate-side end face of the bonded substrate satisfies $Li/(Li+Ta)\times100=(48.5+\beta)$ mol % where $\beta$ is in the range of $-0.5<\beta<0.5$, and also that the $LiTaO_3$ substrate is of a congruent melt composition.

As described above, from the viewpoints of easiness in manufacturing and manufacturing cost, the bonded substrate of the present invention is preferably manufactured based on a $LiTaO_3$ substrate having a congruent melt composition obtained through an ordinary Czochralski method and having been subjected to a Li diffusion treatment by means of a gas phase method. This way, the Li concentration inside the $LiTaO_3$ substrate becomes $Li/(Li+Ta)\times100=(48.5+\beta)$ mol % (wherein $-0.5<\beta<0.5$), which is close to the congruent melt composition; and after bonding this $LiTaO_3$ substrate to a base plate, the $LiTaO_3$ substrate is machined by grinding or polishing or the like to expose the inside of the $LiTaO_3$ substrate, whereby it is possible to obtain a bonded substrate wherein the Li concentration at the $LiTaO_3$ substrate-side end face of the bonded substrate is $Li/(Li+Ta)\times100=(48.5+\beta)$ mol % where $\beta$ is in the range of $-0.5<\beta<0.5$.

In addition, the area in which the Li concentration satisfies $Li/(Li+Ta)\times100=(48.5+\beta)$ mol % where $\beta$ is in the range of $-0.5<\beta<0.5$ can be arbitrarily determined. However, if this area is narrowed relative to the thickness of the $LiTaO_3$ substrate constituting the bonded substrate, it becomes necessary to lengthen the Li diffusion treatment time, with a consequence that warping and cracking are more likely to occur in the substrate; so this area of the said Li concentration is preferably substantially thick. It is preferable that said area is formed to extend from the $LiTaO_3$ substrate-side end face of the bonded substrate toward the base plate-bonding face of the $LiTaO_3$ substrate over about 1 to 20 times the wavelength of the surface acoustic wave or the leaky surface acoustic wave.

The thickness of the $LiTaO_3$ substrate in the bonded substrate of the present invention is preferably greater than 5 times but less than 20 times the wavelength of the surface acoustic wave or that of the leaky surface acoustic wave. In this way, it is possible to suppress an unnecessary response caused by the reflection of the acoustic wave at the bonding interface.

In the present invention, the wavelength of the surface acoustic wave or the leaky surface acoustic wave are, respectively, the wavelength of the surface acoustic wave or the leaky surface acoustic wave when the bonded substrate is used as the surface acoustic wave device, and they are determined by the frequency of the electric signal input to the bonded substrate (surface acoustic wave device) and the velocity of the surface wave (leaky wave). The velocity of the surface wave varies depending on the material and is about 4000 m/s for $LiTaO_3$. Therefore, in the case of manufacturing a surface acoustic wave device for 1 GHz from a composite substrate using $LiTaO_3$ as the piezoelectric single crystal substrate, the wavelength of the surface acoustic wave becomes about 4 μm. In the case of manufacturing a surface acoustic wave device for 2 GHz, the wavelength of the surface acoustic wave is about 2 μm, and in the case of manufacturing a surface acoustic wave device for 800 MHz, the wavelength of the surface acoustic wave is about 5 μm.

Although the crystal orientation of the $LiTaO_3$ substrate constituting the present invention can be arbitrarily selected, it is preferable, from the viewpoint of characteristics, that it is 36° rotated Y-cut through 49° rotated Y-cut. Also, the material to make the plate used as the base plate is not particularly limited, but it is preferably selected from Si, SiC, spinel and sapphire.

Even if a $LiNbO_3$ substrate is used in place of the $LiTaO_3$ substrate constituting the present invention, the value Q can be improved similarly as in the case of the bonded substrate using the $LiTaO_3$ substrate.

Accordingly, the present invention is also characteristic in that, in a bonded substrate composed of a $LiNbO_3$ substrate and a base plate bonded together, the Li concentration at a base plate-bonding face of the $LiNbO_3$ substrate is greater than the Li concentration at a $LiNbO_3$ substrate-side end face of the bonded substrate.

In addition, the difference between the Li concentration at the base plate-bonding face of the $LiNbO_3$ substrate and the Li concentration at the $LiNbO_3$ substrate-side end face of the bonded substrate is preferably 0.1 mol % or greater.

It is preferable that the Li concentration at the base plate-bonding face of the $LiNbO_3$ substrate satisfies $Li/(Li+Nb)\times100=(50+\alpha)$ mol % where $\alpha$ is in the range of $-1.2<\alpha<0.5$, and that the Li concentration at the $LiNbO_3$ substrate-side end face of the bonded substrate satisfies Li/(Li+Nb)×100=(48.5+β) mol % where β is in the range of −0.5<β<0.5.

Furthermore, the thickness of the LiNbO$_3$ substrate in the bonded substrate is preferably greater than 5 times but less than 20 times the wavelength of the surface acoustic wave or that of the leaky surface acoustic wave.

It is also preferable that an area in which the Li concentration satisfies the above formula meant for the base plate-bonding face of the LiNbO$_3$ substrate of the present invention extends from this bonding face of the LiNbO$_3$ substrate toward the LiNbO$_3$ substrate-side end face of the bonded substrate by a distance of 0.1 through 4 times the wavelength of the surface acoustic wave or that of the leaky surface acoustic wave.

It is furthermore preferable that the bonded substrate of the present invention has an area extending from the bonding face of the LiNbO$_3$ substrate toward the LiNbO$_3$ substrate-side end face of the bonded substrate in which (area) the Li concentration decreases as the depth from the bonding face of the LiNbO$_3$ substrate increases; and it is further preferable that this area, in which the Li concentration thus decreases, is formed to have a thickness of 1 through 5 times the wavelength of the surface acoustic wave or that of the leaky surface acoustic wave. In addition to this, the range of the Li concentration in the LiNbO$_3$ substrate-side end face of the bonded substrate of the present invention is preferably formed over a span of 1 through 20 times the wavelength of the surface acoustic wave or that of the leaky surface acoustic wave from the LiNbO$_3$ substrate-side end face of the bonded substrate toward the bonding face of the LiNbO$_3$ substrate.

It is preferable that the crystal orientation of the LiNbO$_3$ substrate of the present invention is rotated from 0° Y through 30° Y cut or 128°±5° Y cut, and also that the base plate used in the present invention is made of a material selected from Si, SiC, Spinel, and sapphire.

It is desirable to fabricate a surface acoustic wave device using one of these bonded substrates of the present invention, because a resonator having a large value of Q can be constructed.

The bonded substrate according to the present invention can be manufactured in the following manner: a base plate and a LiTaO$_3$ substrate in which the Li concentration is greater at the surface of the substrate than inside the substrate are bonded together; a surface layer at the LiTaO$_3$ substrate-side end face of the bonded substrate which lies opposite the bonding face of the LiTaO$_3$ substrate is removed in a manner such that the Li concentration at the bonding face of the LiTaO$_3$ substrate becomes greater than that at the LiTaO$_3$ substrate-side end face of the bonded substrate. On this occasion, it is also possible to bond a base plate on each one of the faces of a LiTaO$_3$ substrate in which the Li concentration is greater at the surface than inside the substrate, and then divide the LiTaO$_3$ substrate in half across thickness-wise middle plane, to thereby obtain bonded substrates. In this way, two bonded substrates can be obtained from one LiTaO$_3$ substrate, which is also desirable from the viewpoint of cost.

Such a manufacturing method can similarly be applied to the case of a LiNbO$_3$ substrate.

The Li concentration of the LiTaO$_3$ substrate or the LiNbO$_3$ substrate constituting the bonded substrate of the present invention may be measured by a known method, for example, by Raman spectroscopy. In the case of LiTaO$_3$ single crystal, it is known that there exists a roughly linear relationship between the half width of the Raman shift peak and the Li concentration (Li/(Li+Ta) value) (See 2012 IEEE International Ultrasonics Symposium Proceedings, Page(s): 1252-1255, Applied Physics A 56, 311-315 (1993)).

Therefore, by using a formula expressing such a relationship, it is possible to evaluate the composition at an arbitrary position in an oxide single crystal substrate.

A formula expressing a relationship between the half width of the Raman shift peak and the Li concentration can be obtained by measuring the Raman half width of a number of samples whose Li concentrations are different and whose compositions are known; if the conditions of the Raman measurement are identical, it is also possible to use a formula that has been already publicized such as in a literature.

For example, in the case of lithium tantalate single crystal, the following Formula (1) may be used (See IEEE International Ultrasonics Symposium Proceedings, Page(s): 1252-1255).

$$Li/(Li+Ta)=(53.15-0.5\ FWHM1)/100 \quad (1)$$

wherein, "FWHM1" is the full width at half maximum of the Raman shift peak around 600 cm$^{-1}$.

Please refer to the literature for details of measurement conditions.

The value Q of the SAW resonator formed on the bonded substrate of the present invention and that of the SAW resonator of a comparative example were obtained through the following Formula (2) described in p. 861 of the publicized literature "2010 IEEE International Ultrasonics Symposium Proceedings Page(s): 861-863". This equation appears as formula (1) in the said literature, but since it overlaps with the above-described formula number, it is given a formula number (2) in this specification.

$$Q(f)=\omega*\tau(f)*|\Gamma|/(1-|\Gamma|^2)$$

wherein, ω is the angular frequency, τ(f) is the group delay time, and Γ is the reflection coefficient measured by a network analyzer.

EXAMPLES

Hereinafter, examples of the present invention and comparative examples will be described more specifically.

Example 1

In Example 1, first, a singly polarized 4-inch diameter LiTaO$_3$ single crystal ingot having a roughly congruent composition and having a Li:Ta ratio of 48.4:51.6 was sliced to obtain a number of 370-μm-thick 42° rotated Y-cut LiTaO$_3$ substrates. Thereafter, in view of a circumstance, the surface roughness of each sliced wafer was adjusted to 0.15 μm in arithmetic average roughness Ra value by a lapping procedure, and the after-finish thickness was set to 350 μm.

After the front and back faces of each resulting substrate were finished into a quasi-mirror surface having a Ra value of 0.01 μm by planar polishing, the substrate was buried in a powder containing Li, Ta and O with Li$_3$TaO$_4$ as a main component. On this occasion, the powder in which Li$_3$TaO$_4$ was a main component was prepared by mixing Li$_2$CO$_3$ powder and Ta$_2$O$_5$ powder at a molar ratio of 7:3, followed by baking at 1300° C. for 12 hours. Then, this powder containing Li$_3$TaO$_4$ as a main component was laid in a small container, and a plurality of said sliced wafers were buried in this Li$_3$TaO$_4$ powder.

Then, this small container was set in an electric furnace, which was subsequently filled with an N$_2$ atmosphere and heated at 900° C. for 20 hours, to thereby cause Li to diffuse into the sliced wafer from the surface toward the middle thereof. Thereafter, during the temperature lowering stage of this diffusion treatment, the thus treated slice substrate was subjected to an anneal treatment at 800° C. for 12 hours, and during the subsequent stage where the wafer was allowed to cool further from 770° C. to 500°, an electric field of 4000 V/m was applied in roughly +Z axis direction, and thereafter a treatment was conducted to cause the temperature to fall to the room temperature. Incidentally, after the application of the electric field, the furnace atmosphere may be changed to be the atmosphere.

Also after this treatment, a rougher side face of each wafer was subjected to a sandblasting to finish it to an Ra value of about 0.15 μm, and the other quasi-mirror side face thereof was polished 3 μm deep and thus a plurality of $LiTaO_3$ single crystal substrates were obtained.

Next, the thus obtained $LiTaO_3$ substrate and a 230 μm-thick Si substrate were bonded together by a room temperature bonding method described in "Takagi H. et al, "Room-temperature wafer bonding using argonbeam activation" From Proceedings—Electrochemical Society (2001), 99-35 (Semiconductor Wafer Bonding: Science, Technology, and Applications V), 265-274." whereby a number of bonded substrates were obtained.

Specifically, a cleaned substrate was set in a high vacuum chamber; a high-speed atomic beam of argon whose ion beam has been neutralized is irradiated on the surface of the substrate to activate it (activation treatment); thereafter, the $LiTaO_3$ single crystal substrate was bonded to the Si base plate. The $LiTaO_3$ substrate-side end face of the thus obtained bonded substrate was subjected to grinding and polishing in a manner such that what remained of the $LiTaO_3$ substrate on the bonding interface of this bonded substrate came to have a thickness of 28 μm, and thus a bonded substrate consisting of a rotated Y-cut $LiTaO_3$ substrate diffused with Li and the Si base plate was prepared.

Figure 1:
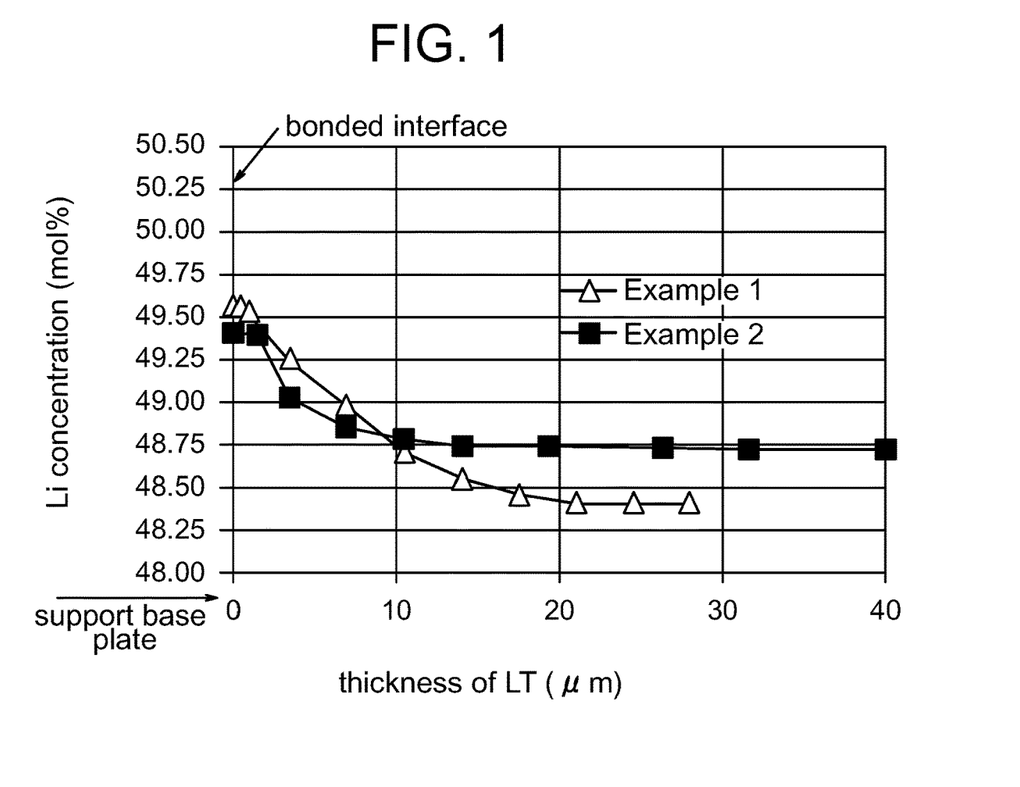
FIG. 1 A diagram showing a model of Li content profiles of $LiTaO_3$ substrates respectively constituting bonded substrates of Example 1 and Example 2.

Next, with respect of one of the thus prepared bonded substrates, or more particularly with respect to the middle portion of the bonded substrate, a laser Raman spectrometer (LabRam HR series manufactured by HORIBA Scientific Inc., Ar ion laser, spot size 1 μm, room temperature) was used to measure the half-value width "FWHM1" of the Raman shift peak around 600 $cm^{-1}$, which is an indicator of the Li diffusion amount, the measurement proceeding in a depth-wise direction from the $LiTaO_3$-side surface, and the Li concentration was calculated using the above-described Formula (1); and as the result a Li concentration profile as shown in FIG. 1 was obtained.

According to the result shown in FIG. 1, regarding this bonded substrate, at the base plate-bonding face of the $LiTaO_3$ substrate the Li concentration was 49.6 mol % and the α value was −0.4 and at the $LiTaO_3$ substrate-side end face of the bonded substrate the Li concentration was 48.4 mol % and the β value was −0.1, so that it was confirmed that the Li concentration at the base plate-bonding face of the $LiTaO_3$ substrate was higher than the Li concentration at the $LiTaO_3$ substrate-side end face of the bonded substrate. Further, the difference between the Li concentration at the base plate-bonding face of the $LiTaO_3$ substrate and the Li concentration at the $LiTaO_3$ substrate-side end face of the bonded substrate was 1.2 mol %.

In addition, with respect to the area ranging between 0 μm and about 0.5 μm in depth as measured from the bonding interface toward the $LiTaO_3$ substrate-side end face of the bonded substrate, the results indicated Li/(Li+Ta)=49.6 mol % and a presence of pseudo stoichiometry composition. It was confirmed that the bonded substrate had in the vicinity of its surface layer a transition layer having a thickness of about 20 μm, in which the Li concentration decreased as the measurement moved toward the $LiTaO_3$ substrate-side end face of the bonded substrate; it was also confirmed that there was an area ranging from the $LiTaO_3$ substrate-side end face of the bonded substrate to a depth of about 8 μm wherein the Li concentration indicated that Li/(Li+Ta)=48.4 mol % and an existence of a roughly congruent composition.

Further, when the warpage of this bonded substrate was measured by the interference method using laser light, the value obtained was as large as 200 μm, while cracks and chippings were not observed.

Next, on the $LiTaO_3$ substrate-side end face of the bonded substrate as obtained in this manner, an Al film having a thickness of 0.2 μm was formed by means of a sputtering method, and at the same time, by means of a photolithography using a g-line as the light source, a SAW resonator was formed. On this occasion, the Al electrode was shaped by RIE (reactive ion etching), and a mixed gas of $BCl_3$, $Cl_2$, $CF_4$, and $N_2$ was used as the gas for this RIE.

At this time, the thickness of the $LiTaO_3$ substrate in the bonded substrate was 28 μm, which is seven times the wavelength of the surface acoustic wave or that of the leaky surface acoustic wave, for the latter were roughly 4 μm.

Figure 2:
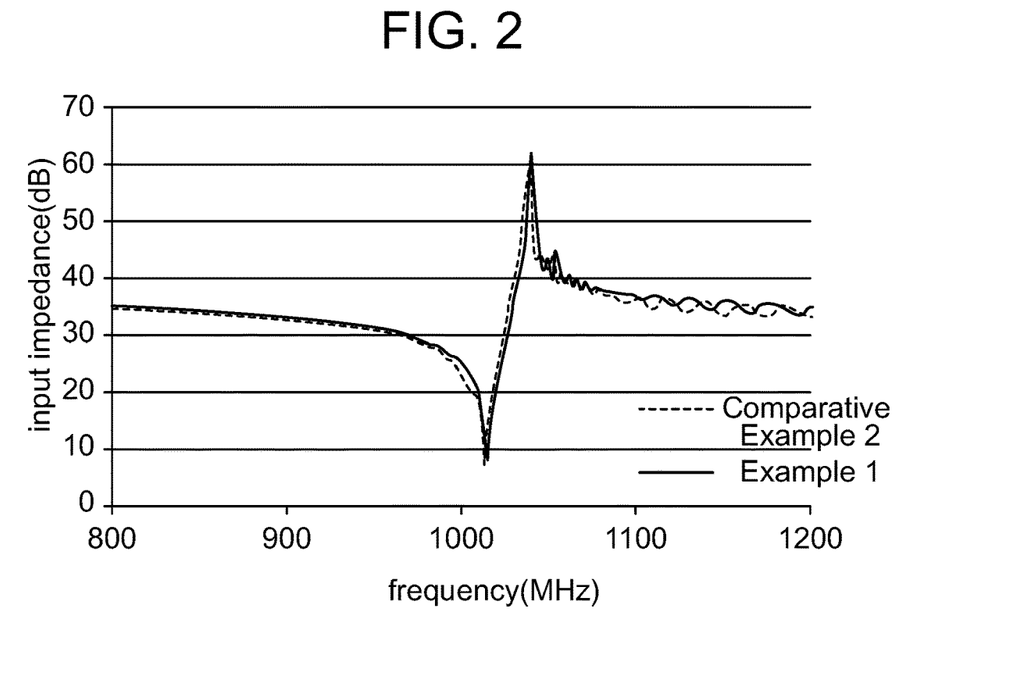
FIG. 2 A diagram showing input impedance waveforms of resonators formed respectively on a bonded substrate of Example 1 and a bonded substrate of Comparative Example 2.

Then, the thus fabricated evaluation purpose SAW resonator was measured by an RF prober for its property and the measurement result was as shown in FIG. 2. According to the result shown in FIG. 2, in the case of Example 1, it was confirmed that a resonance waveform which is on the whole good was obtained.

Figure 3:
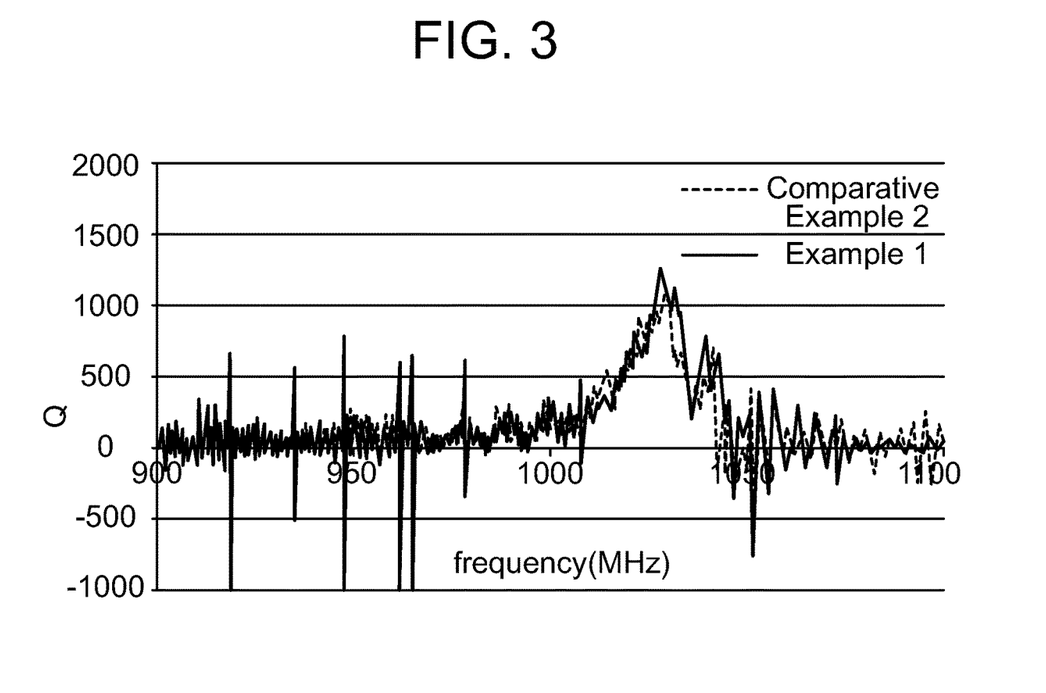
FIG. 3 A diagram showing a result of measuring the values Q of resonators formed respectively on a bonded substrate of Example 1 and a bonded substrate of Comparative Example 2.

Next, the values of S11 and the group delay time as measured by the above RF prober were input to a recording medium from a network analyzer, and the value Q was obtained by means of the above equation (2), and the result is shown in FIG. 3. According to the result shown in FIG. 3, the maximum value of Q was 1280.

Example 2

In Example 2, first, a singly polarized 4-inch diameter $LiTaO_3$ single crystal ingot having a roughly congruent composition and having a Li:Ta ratio of 48.75:51.25 was sliced to obtain a number of 370-μm-thick 42° rotated Y-cut $LiTaO_3$ substrates. Thereafter, in view of a circumstance, the surface roughness of each sliced wafer was adjusted to 0.15 μm in arithmetic average roughness Ra value by a lapping procedure, and the after-finish thickness was set to 350 μm.

After the front and back faces of each resulting substrate were finished into a quasi-mirror surface having a Ra value of 0.01 μm by planar polishing, the substrate was buried in a powder containing Li, Ta and O with $Li_3TaO_4$ as a main component. On this occasion, the powder in which $Li_3TaO_4$ was a main component was prepared by mixing $Li_2CO_3$ powder and $Ta_2O_5$ powder at a molar ratio of 7:3, followed by baking at 1300° C. for 12 hours. Then, this powder containing $Li_3TaO_4$ as a main component was laid in a small container, and a plurality of said sliced wafers were buried in this $Li_3TaO_4$ powder.

Then, this small container was set in an electric furnace, which was subsequently filled with an $N_2$ atmosphere and heated at 900° C. for 10 hours, to thereby cause Li to diffuse into the sliced wafer from the surface toward the middle thereof. Thereafter, during the temperature lowering stage of this diffusion treatment, the thus treated slice substrate was subjected to an anneal treatment at 800° C. for 12 hours, and during the subsequent stage where the wafer was allowed to cool further from 770° C. to 500°, an electric field of 4000 V/m was applied in roughly +Z axis direction, and thereafter a treatment was conducted to cause the temperature to fall to the room temperature. Incidentally, after the application of the electric field, the furnace atmosphere may be changed to be the atmosphere.

After this treatment, a bonded substrate was prepared in the same manner as in Example 1, and the LiTaO$_3$ substrate-side end face of the thus obtained bonded substrate was subjected to grinding and polishing in a manner such that what remained of the LiTaO$_3$ substrate on the bonding interface of this bonded substrate came to have a thickness of 40 µm, and thus a bonded substrate consisting of a rotated Y-cut LiTaO$_3$ substrate diffused with Li and the Si base plate was prepared.

Next, with respect of one of the thus prepared bonded substrates, or more particularly with respect to the middle portion of this bonded substrate, a laser Raman spectrometer (LabRam HR series manufactured by HORIBA Scientific Inc., Ar ion laser, spot size 1 µm, room temperature) was used to measure the half-value width "FWHM1" of the Raman shift peak around 600 cm$^{-1}$, which is an indicator of the Li diffusion amount, the measurement proceeding in a depth-wise direction from the LiTaO$_3$-side surface, and the Li concentration was calculated using the above-described Formula (1); and as the result a Li concentration profile as shown in FIG. 1 was obtained.

According to the result shown in FIG. 1, regarding this bonded substrate, at the base plate-bonding face of the LiTaO$_3$ substrate the Li concentration was 49.4 mol % and the α value was −0.6 and at the LiTaO$_3$ substrate-side end face of the bonded substrate the Li concentration was 48.75 mol % and the β value was 0.25, so that it was confirmed that the Li concentration at the base plate-bonding face of the LiTaO$_3$ substrate was higher than the Li concentration at the LiTaO$_3$ substrate-side end face of the bonded substrate. Further, the difference between the Li concentration at the base plate-bonding face of the LiTaO$_3$ substrate and the Li concentration at the LiTaO$_3$ substrate-side end face of the bonded substrate was 0.65 mol %.

In addition, with respect to the area ranging between 0 µm and about 2 µm in depth as measured from the bonding interface toward the LiTaO$_3$ substrate-side end face of the bonded substrate, the results indicated Li/(Li+Ta)=49.4 mol % and a presence of pseudo stoichiometry composition. It was confirmed that the bonded substrate had in the vicinity of its surface layer a transition layer having a thickness of about 8 µm, in which the Li concentration decreased as the measurement moved toward the LiTaO$_3$ substrate-side end face of the bonded substrate; it was also confirmed that there was an area ranging from the LiTaO$_3$ substrate-side end face of the bonded substrate to a depth of about 30 µm wherein the Li concentration indicated that Li/(Li+Ta)=48.75 mol % and an existence of a roughly congruent composition.

Further, when the warpage of this bonded substrate was measured by the interference method using laser light, the value obtained was as small as 40 µm, while cracks and chippings were not observed.

Figure 4:
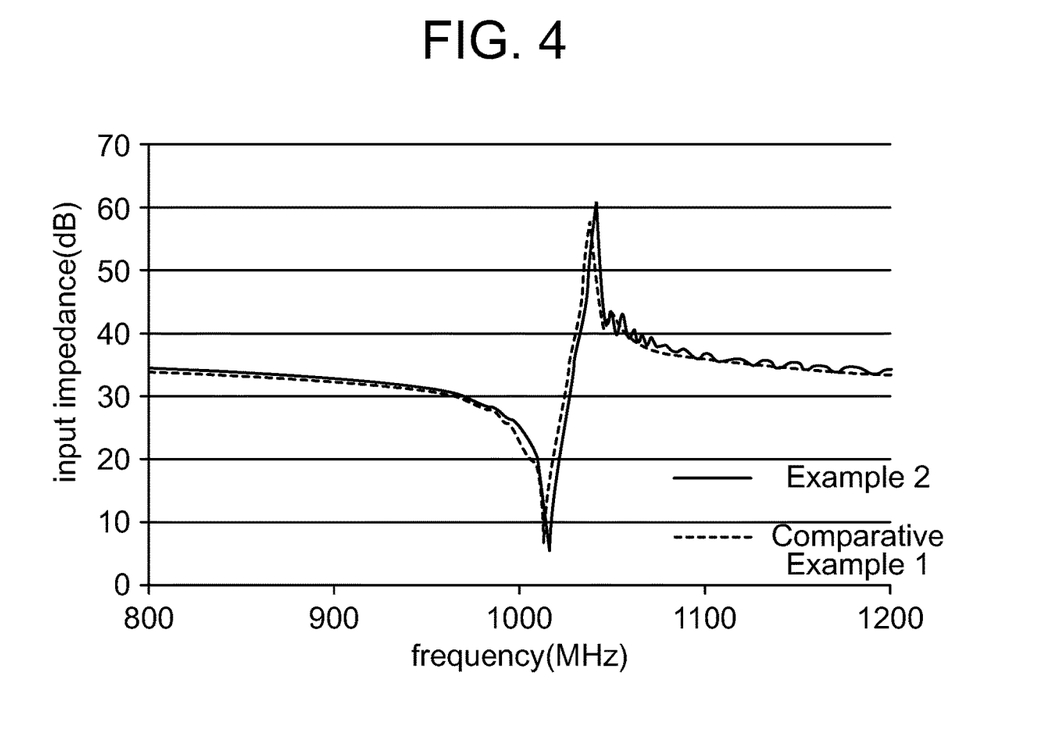
FIG. 4 A diagram showing input impedance waveforms of resonators formed respectively on a bonded substrate of Example 2 and a bonded substrate of Comparative Example 1.

Next, using this bonded substrate, a SAW resonator whose one-wave length was about 4 µm was fabricated, and the thus fabricated evaluation purpose SAW resonator was measured by an RF prober for its property and the measurement result was as shown in FIG. 4. According to the result shown in FIG. 4, in the case of Example 2 too, it was confirmed that a resonance waveform which is on the whole good was obtained.

At this time, the thickness of the LiTaO$_3$ substrate in the bonded substrate was 40 µm, which is 10 times the wavelength of the surface acoustic wave or that of the leaky surface acoustic wave, for the latter were roughly 4 µm.

Figure 5:
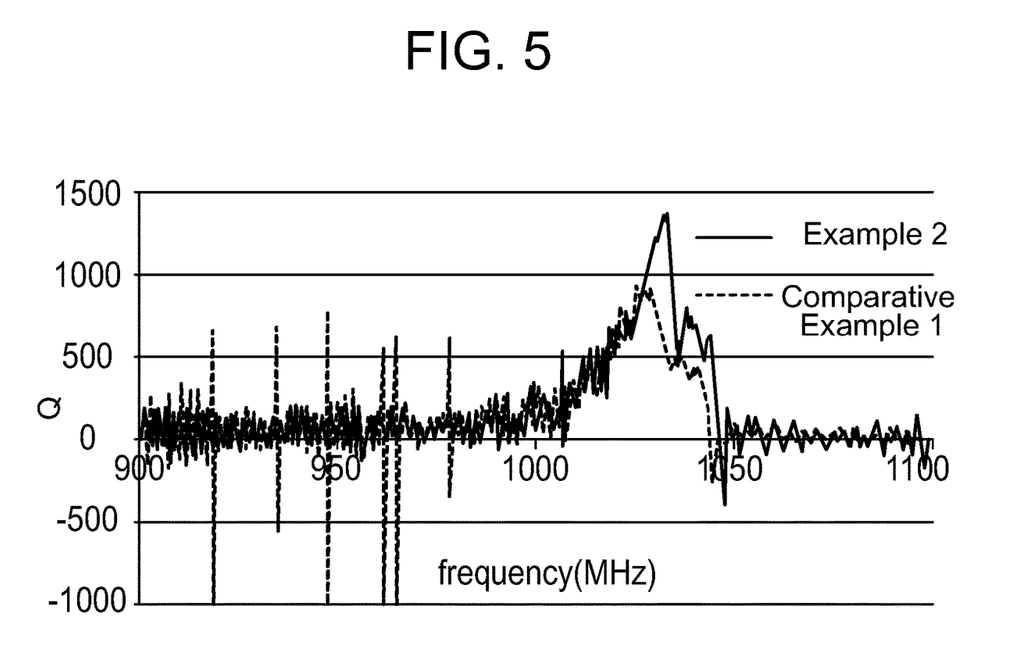
FIG. 5 A diagram showing a result of measuring the values Q of resonators formed respectively on a bonded substrate of Example 2 and a normal $LiTaO_3$ substrate of Comparative Example 1.

Next, the values of S11 and the group delay time as measured by the above RF prober were input to the recording medium from the network analyzer, and the Value Q was obtained by means of the above equation (2), and the result is shown in FIG. 5. According to the result shown in FIG. 5, the maximum value of Q was 1380.

Comparative Example 1

In Comparative Example 1, a singly polarized 4-inch diameter LiTaO$_3$ single crystal ingot having a roughly congruent composition and having a Li:Ta ratio of 48.4:51.6 was processed and lapped similarly as in Example 1, and a wafer having an after-finish thickness of 350 µm was made.

Next, after this lapping, the both faces of the wafer were finished by planar polishing into mirror surfaces having a Ra value of 0.0001 µm, and thus a plurality of LiTaO$_3$ single crystal substrates having a roughly congruent composition were fabricated.

Then, similarly as in Example 1, with respect to one of the thus prepared LiTaO$_3$ single crystal substrate, or more particularly with respect to the middle portion of this substrate, a laser Raman spectrometer was used to measure the half-value width "FWHM1" of the Raman shift peak around 600 cm$^{-1}$, which is an indicator of the Li diffusion amount, the measurement proceeding in a depth-wise direction from the surface, and the Li concentration was calculated using the above-described Formula (1); and as the result it was found that the Li concentration of this LiTaO$_3$ substrate remained roughly constant at 48.4 mol % in the depth-wise direction and showed a roughly congruent composition.

Next, the warping of this substrate was measured by the interference method using a laser beam, and the value obtained was as small as 40 µm, and cracks and chipping were not observed.

Next, on the surface of the substrate as obtained in this manner, an Al film having a thickness of 0.2 µm was formed by means of a sputtering method, and at the same time, by means of a photolithography using a g-line as the light source, a SAW resonator whose one-wave length was about 4 µm formed. On this occasion, the Al electrode was shaped by RIE (reactive ion etching), and a mixed gas of BCl$_3$, Cl$_2$, CF$_4$, and N$_2$ was used as the gas for this RIE.

Then, the thus fabricated evaluation purpose SAW resonator was measured by an RF prober for its property and the measurement result was as shown in FIG. 4. According to the result shown in FIG. 4, in the case of Comparative Example 1, it was confirmed that a resonance waveform which is on the whole good was obtained.

Next, the values of S11 and the group delay time as measured by the above RF prober were input to the recording medium from a network analyzer, and the value Q was obtained by means of the above equation (2), and the result is shown in FIG. 5. According to the result shown in FIG. 5, the maximum value of Q was 900, and this was lower than the values Q in the cases of Example 1 and Example 2.

Comparative Example 2

In Comparative Example 2, a singly polarized 4-inch diameter LiTaO$_3$ single crystal ingot having a roughly congruent composition and having a Li:Ta ratio of 48.4:51.6 was processed similarly as in Example 1, and a wafer having an after-finish thickness of 350 µm was made. Next, similarly as in Comparative Example 1, the both faces of this wafer were finished by planar polishing into mirror surfaces having a Ra value of 0.0001 µm, and thus a plurality of LiTaO$_3$ single crystal substrates having a roughly congruent composition were fabricated. Thereafter, similarly as in Example 1, this LiTaO$_3$ substrate was bonded to a 230-µm-thick Si base plate; then the LiTaO$_3$ substrate-side end face of the thus obtained bonded substrate was subjected to grinding and polishing in a manner such that what remained of the LiTaO$_3$ substrate on the bonding interface of this bonded substrate came to have a thickness of 28 µm, and thus a bonded substrate consisting of a rotated Y-cut LiTaO$_3$ substrate and the Si base plate was prepared.

Then, similarly as in Example 1, with respect of one of the thus prepared bonded substrate, or more particularly with respect to the middle portion of this bonded substrate, a laser Raman spectrometer was used to measure the half-value width "FWHM1" of the Raman shift peak around 600 cm$^{-1}$, which is an indicator of the Li diffusion amount, the measurement proceeding in a depth-wise direction from the LiTaO$_3$ substrate-side end face, and the Li concentration was calculated using the above-described Formula (1); and as the result it was found that the Li concentration of this LiTaO$_3$ substrate constituting the bonded substrate remained roughly constant at 48.4 mol % in the depth-wise direction and showed a roughly congruent composition so that the Li concentration at the interface between the LiTaO$_3$ substrate and the base plate was roughly equal to the Li concentration at the LiTaO$_3$ substrate-side end face.

Next, the warping of this bonded substrate was measured by an interference method using a laser beam, and the value obtained was as small as 40 µm, and cracks and chipping were not observed.

Next, using this bonded substrate, a SAW resonator whose one-wave length was about 4 µm was fabricated in the similar manner as in Example 1, and the thus fabricated evaluation purpose SAW resonator was measured by an RF prober for its property and the measurement result was as shown in FIG. 2. According to the result shown in FIG. 2, in the case of Comparative Example 2, it was confirmed that a resonance waveform which is on the whole good was obtained.

Next, the values of S11 and the group delay time as measured by the above RF prober were input to the recording medium from a network analyzer, and the value Q was obtained by means of the above equation (2), and the result is shown in FIG. 3. According to the result shown in FIG. 3, the maximum value of Q was 1020, and this was lower than the values Q in the cases of Example 1 and Example 2.

As is confirmed from the comparison made above between Examples 1 and 2, on one hand, and Comparatives Examples 1 and 2, on the other hand, if a bonding substrate of the present invention is used it is possible to obtain the effects arising from α value Q which is greater than is obtained in the case of a conventional LiTaO$_3$ substrate, and from the fact that there is scarce variation in Li concentration. Also, it was confirmed that when the bonding substrate of the present invention has an a which satisfies −1.2<α≤−0.5, especially, and a β which satisfies −0.5<β<0.5, it is possible to obtain a bonded substrate wherein the value Q is further increased and the warping is reduced, and thus it is possible to obtain a high value of Q favorable for surface acoustic wave device.

What is claimed is:

1. A bonded substrate comprising:
   a LiTaO$_3$ substrate having a first surface and a second surface opposite to the first surface; and
   a base plate bonded to the first surface of said LiTaO$_3$ substrate,
   wherein a Li concentration at the first surface of said LiTaO$_3$ substrate is higher than a Li concentration at the second surface of the LiTaO$_3$ substrate of said bonded substrate.

2. A bonded substrate as claimed in claim 1, wherein a difference between the Li concentration at the first surface and the Li concentration at the second surface is 0.1 mol % or greater.

3. A bonded substrate as claimed in claim 1, wherein the Li concentration at the first surface satisfies an equation Li/(Li+Ta)×100=(50+α) mol %, where α is in the range of −1.2<α<0.5.

4. A bonded substrate as claimed in claim 1, wherein the Li concentration at the second surface satisfies an equation Li/(Li+Ta)×100=(48.5+β) mol %, where β is in the range of −0.5<β<0.5.

5. A bonded substrate as claimed in claim 1, wherein the thickness of the LiTaO$_3$ substrate in the bonded substrate is greater than 5 times but less than 20 times the wavelength of the surface acoustic wave or that of the leaky surface acoustic wave.

6. A bonded substrate as claimed in claim 1, wherein an area where Li concentration satisfies said equation for the first surface expands from said bonding face first surface toward the second surface by a thickness of 0.1 through 4 times the wavelength of the surface acoustic wave or that of the leaky surface acoustic wave.

7. A bonded substrate as claimed in claim 1, wherein said bonded substrate possesses an area where Li concentration decreases as it is measured starting from the first surface toward the second surface.

8. A bonded substrate as claimed in claim 7, wherein said area where Li concentration thus decreases is formed through a thickness of 1 through 5 times the wavelength of the surface acoustic wave or that of the leaky surface acoustic wave.

9. A bonded substrate as claimed in claim 1, wherein an area where Li concentration satisfies said equation for the second surface expands from said second surface toward the first surface by a thickness of 1 through 20 times the wavelength of the surface acoustic wave or that of the leaky surface acoustic wave.

10. A bonded substrate as claimed in claim 1, wherein a crystal orientation of said LiTaO$_3$ substrate is 36° rotated Y-cut through 49° rotated Y-cut.

11. A bonded substrate as claimed in claim 1, wherein said base plate comprises a material selected from the group consisting of Si, SiC, Spinel, and sapphire.

12. A surface acoustic wave device comprising the bonded substrate as defined in claim 1.

13. A bonded substrate comprising:
   a LiNbO$_3$ substrate having a first surface and a second surface opposite to the first surface; and
   a base plate bonded to the first surface of said LiNbO$_3$ substrate,
   wherein a Li concentration at a base plate bonding face the first surface of said LiNbO$_3$ substrate is higher than a Li concentration at the second surface of the LiNbO$_3$ substrate of said bonded substrate.

14. A surface acoustic wave device comprising the bonded substrate as defined in claim 13.

15. A method for manufacturing a bonded substrate comprising:
    bonding a base plate to a $LiTaO_3$ substrate such that the $LiTaO_3$ substrate has a first surface bonded to the base plate and a second surface opposite to the first surface, and that the $LiTaO_3$ substrate has a Li concentration greater at a substrate surface portion than an inner portion of the $LiTaO_3$ substrate; and
    removing a surface layer from the second surface such that the Li concentration at the first surface becomes greater than the Li concentration at a surface of the $LiTaO_3$ substrate exposed by the removing.

* * * * *